(12) United States Patent
Togo et al.

(10) Patent No.: US 11,495,629 B2
(45) Date of Patent: Nov. 8, 2022

(54) PHOTOELECTRIC CONVERSION APPARATUS AND EQUIPMENT

(71) Applicant: CANON KABUSHIKI KAISHA, Tokyo (JP)

(72) Inventors: Kenji Togo, Kawasaki (JP); Sakae Hashimoto, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 32 days.

(21) Appl. No.: 16/919,299

(22) Filed: Jul. 2, 2020

(65) Prior Publication Data

US 2021/0020677 A1 Jan. 21, 2021

(30) Foreign Application Priority Data

Jul. 18, 2019 (JP) .............................. JP2019-133124

(51) Int. Cl.
*H01L 27/146* (2006.01)
*H04N 5/353* (2011.01)
*H04N 5/374* (2011.01)

(52) U.S. Cl.
CPC .. *H01L 27/14623* (2013.01); *H01L 27/14636* (2013.01); *H01L 27/14685* (2013.01); *H04N 5/353* (2013.01); *H04N 5/374* (2013.01); *H01L 27/14643* (2013.01)

(58) Field of Classification Search
CPC ......... H01L 27/14623; H01L 27/14636; H01L 27/14685; H01L 27/14643; H01L 27/14612; H01L 27/1462; H01L 27/14627; H04N 5/353; H04N 5/374; H04N 5/361

USPC ......................................................... 348/245
See application file for complete search history.

(56) References Cited

U.S. PATENT DOCUMENTS

| | | | |
|---|---|---|---|
| 4,731,665 A | 3/1988 | Hashimoto et al. |
| 4,816,910 A | 3/1989 | Hashimoto et al. |
| 4,959,723 A | 9/1990 | Hashimoto |
| 4,962,412 A | 10/1990 | Shinohara et al. |
| 5,051,831 A | 9/1991 | Hashimoto |
| 5,060,042 A | 10/1991 | Shinohara et al. |
| 5,146,339 A | 9/1992 | Shinohara et al. |
| 5,283,428 A | 2/1994 | Morishita et al. |
| 6,344,668 B1 | 2/2002 | Hatano et al. |

(Continued)

FOREIGN PATENT DOCUMENTS

JP 2013-110285 A 6/2013

*Primary Examiner* — Albert H Cutler
(74) *Attorney, Agent, or Firm* — Venable LLP

(57) ABSTRACT

A photoelectric conversion apparatus is provided. The apparatus comprises a pixel region in which a plurality of pixels each including a photoelectric conversion portion and a charge holding portion formed in a substrate are arranged, and a peripheral region. Above the substrate, an electrically conductive layer including an electrode pattern for transferring charges in the photoelectric conversion portion to the charge holding portion, a wiring layer including a wiring pattern electrically connected to the electrode pattern, an interlayer film arranged between the wiring layer and the substrate, a metal layer arranged between the interlayer film and the substrate and arranged so as to cover at least the charge holding portion and the electrode pattern are provided. In the peripheral region, the metal layer covers at least an upper surface of an electrically conductive pattern included in the electrically conductive layer.

20 Claims, 11 Drawing Sheets

(56) References Cited

U.S. PATENT DOCUMENTS

| | | |
|---|---|---|
| 7,019,373 B2 | 3/2006 | Hashimoto |
| 7,030,918 B1 | 4/2006 | Nakashiba |
| 7,393,715 B2 | 7/2008 | Tazoe et al. |
| 7,420,236 B2 | 9/2008 | Hashimoto |
| 7,592,645 B2 | 9/2009 | Hashimoto |
| 7,709,918 B2 | 5/2010 | Hashimoto |
| 7,732,884 B2 | 6/2010 | Hashimoto |
| 7,884,434 B2 | 2/2011 | Hashimoto |
| 8,048,710 B2 | 11/2011 | Hashimoto |
| 8,084,287 B2 | 12/2011 | Hashimoto |
| 8,299,557 B2 | 10/2012 | Hashimoto |
| 8,390,088 B2 | 3/2013 | Hashimoto |
| 8,581,358 B2 | 11/2013 | Hashimoto |
| 8,790,952 B2 | 7/2014 | Hashimoto |
| 8,866,249 B2 | 10/2014 | Hashimoto |
| 9,006,852 B2 | 4/2015 | Arakawa |
| 9,490,286 B2 | 11/2016 | Hashimoto |
| 9,818,793 B2 | 11/2017 | Hashimoto |
| 10,367,030 B2 | 7/2019 | Hashimoto |
| 2003/0025815 A1 | 2/2003 | Hashimoto |
| 2008/0036023 A1* | 2/2008 | Park ................. H01L 27/14685 |
| | | 257/E31.127 |
| 2012/0049305 A1* | 3/2012 | Takami ............. H01L 27/14629 |
| | | 257/432 |
| 2015/0349013 A1* | 12/2015 | Shoyama .......... H01L 27/14643 |
| | | 257/292 |
| 2016/0035767 A1 | 2/2016 | Matsuda et al. |
| 2017/0207269 A1* | 7/2017 | Liu ................... H01L 21/76816 |
| 2018/0070041 A1* | 3/2018 | Hirota ..................... H04N 5/335 |
| 2018/0122852 A1* | 5/2018 | Nishimura ........ H01L 27/14683 |
| 2018/0138234 A1 | 5/2018 | Suzuki et al. |
| 2019/0019833 A1 | 1/2019 | Kodaira et al. |
| 2020/0127031 A1 | 4/2020 | Suzuki et al. |

\* cited by examiner

PHOTOELECTRIC CONVERSION APPARATUS AND EQUIPMENT

BACKGROUND OF THE INVENTION

Field of the Invention

The present invention relates to a photoelectric conversion apparatus and an equipment.

Description of the Related Art

In a photoelectric conversion apparatus such as a CMOS image sensor, an arrangement having a global shutter function has been proposed as described in Japanese Patent Laid-Open No. 2013-110285. In the photoelectric conversion apparatus having the global shutter function, when light enters a charge holding portion for holding charges contained in respective pixels and photoelectric conversion occurs, a noise signal is generated. Therefore, it is necessary to suppress entry of light by covering the charge holding portion with a metal layer for shielding light. On the other hand, it is less necessary to shield light in the peripheral region arranged around the pixel region in which the pixels are arranged, the peripheral region can be covered with the metal layer less than the pixel region.

SUMMARY OF THE INVENTION

After the metal layer is formed, the coverage of the metal layer is different between the pixel region and the peripheral region, so that a level difference due to the thickness of the metal layer can be generated between the pixel region and the peripheral region. The level difference between the pixel region and the peripheral region may adversely affect the optical characteristics of the pixel region. Further, due to the level difference between the pixel region and the peripheral region, a residue may exist in a layer above the metal layer, which may decrease the reliability. Furthermore, in a photolithography step of forming a layer above the metal layer during manufacturing, it may become difficult to set exposure conditions such as generation of defocus or the like.

Each of some embodiments of the present invention provides a technique advantageous in improving the performance of a photoelectric conversion apparatus in which a metal layer is arranged.

According to some embodiments, a photoelectric conversion apparatus comprising: a pixel region in which a plurality of pixels each including a photoelectric conversion portion and a charge holding portion formed in a substrate are arranged; and a peripheral region arranged around the pixel region, wherein above the substrate, an electrically conductive layer including an electrode pattern for transferring charges in the photoelectric conversion portion to the charge holding portion, a wiring layer including a wiring pattern electrically connected to the electrode pattern, an interlayer insulating film arranged between the wiring layer and the substrate, a metal layer arranged between the interlayer insulating film and the substrate, and arranged so as to cover at least the charge holding portion and the electrode pattern, and a contact plug configured to electrically connect the wiring pattern and the electrode pattern and extending through the interlayer insulating film are provided, and in the peripheral region, the metal layer covers at least an upper surface of an electrically conductive pattern included in the electrically conductive layer, is provided.

According to some other embodiments, a photoelectric conversion apparatus comprising: a pixel region in which a plurality of pixels each including a photoelectric conversion portion and a charge holding portion formed in a substrate are arranged; and a peripheral region arranged around the pixel region, wherein above the substrate, an electrically conductive layer including an electrode pattern for transferring charges in the photoelectric conversion portion to the charge holding portion, a wiring layer including a wiring pattern electrically connected to the electrode pattern, an interlayer insulating film arranged between the wiring layer and the substrate, a metal layer arranged between the interlayer insulating film and the substrate, and a contact plug configured to electrically connect the wiring pattern and the electrode pattern and extending through the interlayer insulating film are provided, and the metal layer separately includes a pattern that covers at least the charge holding portion and the electrode pattern in the pixel region and a pattern that covers at least an upper surface of an electrically conductive pattern included in the electrically conductive layer in the peripheral region, is provided.

Further features of the present invention will become apparent from the following description of exemplary embodiments (with reference to the attached drawings).

DESCRIPTION OF THE EMBODIMENTS

Figure 1A:
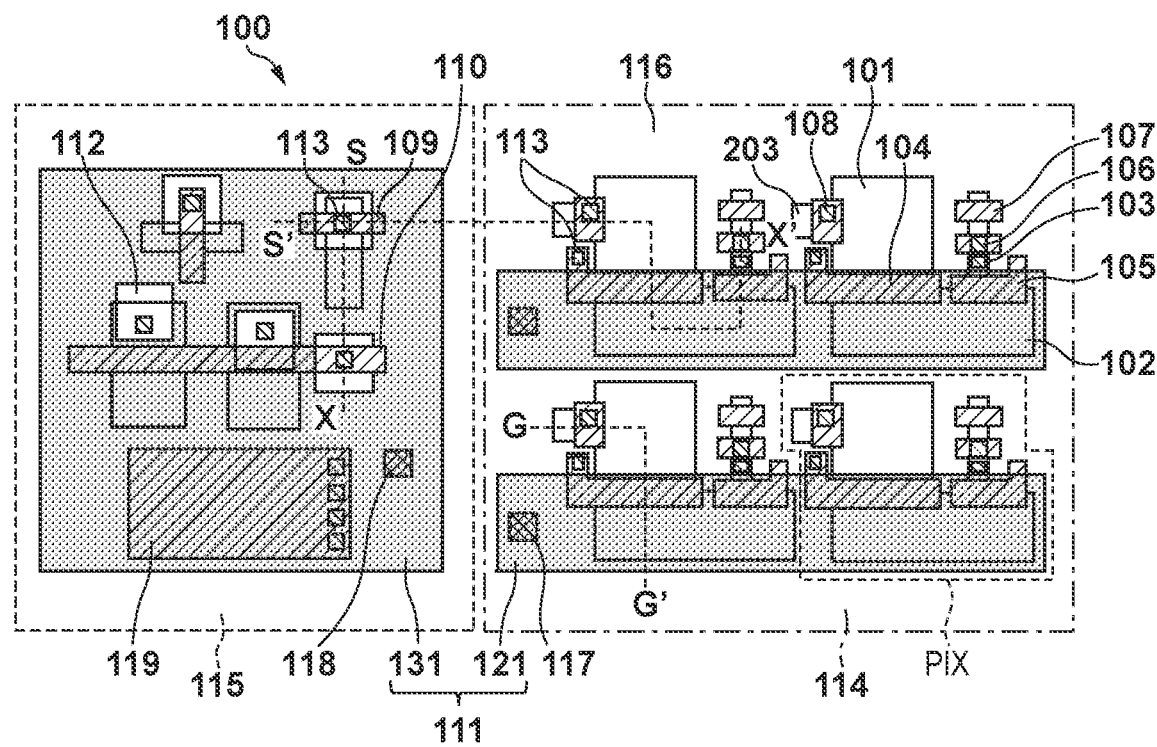
FIGS. 1A and 1B are a plan view and a sectional view, respectively, showing an arrangement example of a photoelectric conversion apparatus according to the first embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

With reference to FIGS. 1A to 6B, the arrangement and manufacturing method of a photoelectric conversion apparatus according to the first embodiment will be described. FIG. 1A is a plan view showing an arrangement example of a photoelectric conversion apparatus 100 in this embodiment, and FIG. 1B is a sectional view taken along a line X-X' shown in FIG. 1A.

The photoelectric conversion apparatus 100 includes a pixel region 114 in which a plurality of pixels PIX each including a photoelectric conversion portion 101 and a charge holding portion 102 formed in a substrate 200 are arranged. In the pixel region 114, the plurality of pixels PIX can be arranged in a two-dimensional array. The photoelectric conversion apparatus 100 also includes a peripheral region 115 arranged around the pixel region 114. Peripheral transistors 109 and 110 for controlling the plurality of pixels PIX are arranged in the peripheral region 115. The peripheral transistors 109 and 110 are not limited to the transistors that control an operation of the pixel PIX, and may be transistors that process a signal output from the pixel PIX, or may control various types of components such as a memory arranged in the peripheral region 115.

In each pixel PIX in the pixel region 114 of the photoelectric conversion apparatus 100, a transistor 104 that transfers charges from the photoelectric conversion portion 101 to the charge holding portion 102, a transistor 105 that transfers the charges from the charge holding portion 102 to a floating diffusion (to be referred to as FD hereinafter) 103, a source follower (to be referred to as SF hereinafter) transistor 106 that converts the charges of the FD 103 into a voltage, a reset transistor 107 that is connected to the FD 103, and an overflow drain (to be referred to as OFD hereinafter) transistor 108 are arranged. These transistors arranged in the pixel region 114 are sometimes referred to as pixel transistors in order to distinguish them from the peripheral transistors 109 and 110 described above. Here, a layer including the gate electrode of the transistor 104 which is an electrode pattern for transferring the charges in the photoelectric conversion portion 101 to the charge holding portion 102 is referred to as an "electrically conductive layer". The electrically conductive layer is formed of, for example, polysilicon or the like, and can be mainly formed by one film formation and one patterning. Therefore, the electrically conductive layer includes the gate electrode of each of the pixel transistors and the gate electrode of each of the peripheral transistors 109 and 110. That is, the electrically conductive layer is arranged in both the pixel region 114 and the peripheral region 115.

Above the substrate 200, a wiring layer including a wiring pattern electrically connected to the electrode pattern (gate electrode) of the transistor 104 is arranged. In this embodiment, the wiring layer includes wiring patterns 216, 218, and 220. The wiring patterns 216, 218, and 220 can be electrically connected to not only the electrode pattern (gate electrode) of the transistor 104 but also the electrically conductive layer of the other pixel transistors and the peripheral transistors 109 and 110. In the arrangement shown in FIG. 1B, the electrically conductive layer of each of the pixel transistors and the peripheral transistors 109 and 110 is connected to the wiring pattern 216 by a contact plug 113, but the arrangement is not limited to this. For example, the electrically conductive layer may be directly connected to the wiring patterns 218 and 220 by a contact plug. An interlayer insulating film 214 is arranged between the wiring pattern 216 and the substrate 200 and between the wiring patterns 216, 218, and 220. The contact plug 113 is provided so as to extend through the interlayer insulating film 214. In other words, the contact plug 113 is surrounded by the interlayer insulating film 214. The contact plug 113 can be in contact with the interlayer insulating film 214. The contact plug 113 can include an electrically conductive portion made of tungsten or the like, and a barrier metal portion made of titanium, titanium nitride, or the like arranged between the electrically conductive portion and the interlayer insulating film 214.

Figure 1B:
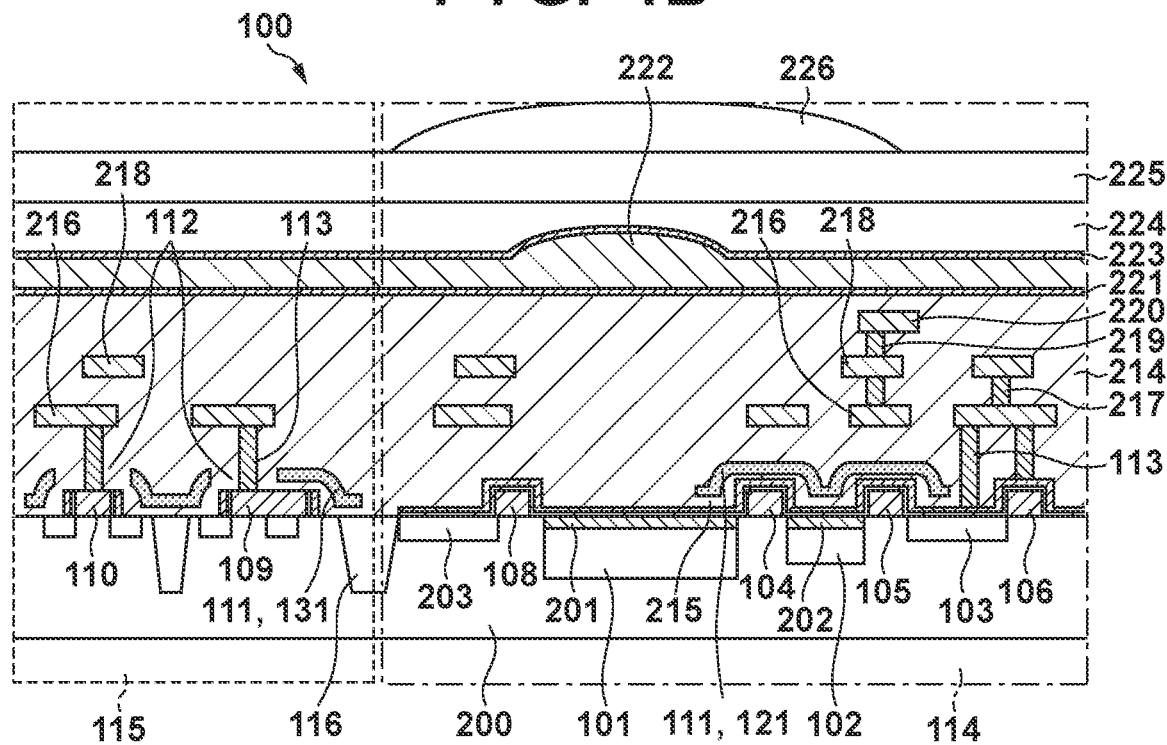
Figure 2A:
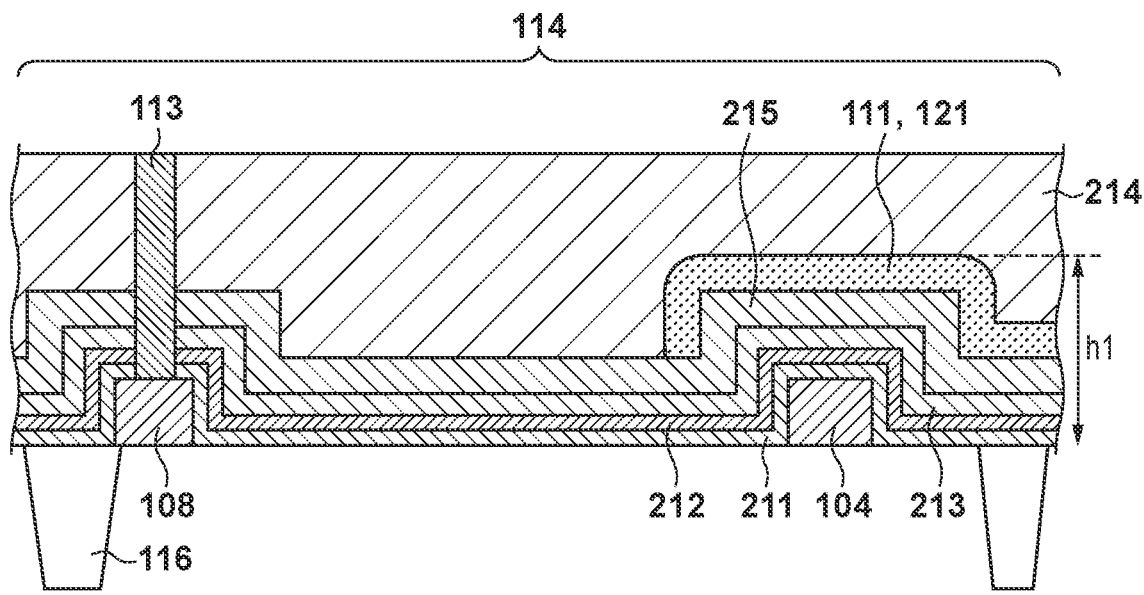
FIG. 2A is a sectional view showing an arrangement example of a pixel region of the photoelectric conversion apparatus shown in FIGS. 1A and 1B.
Figure 2B:
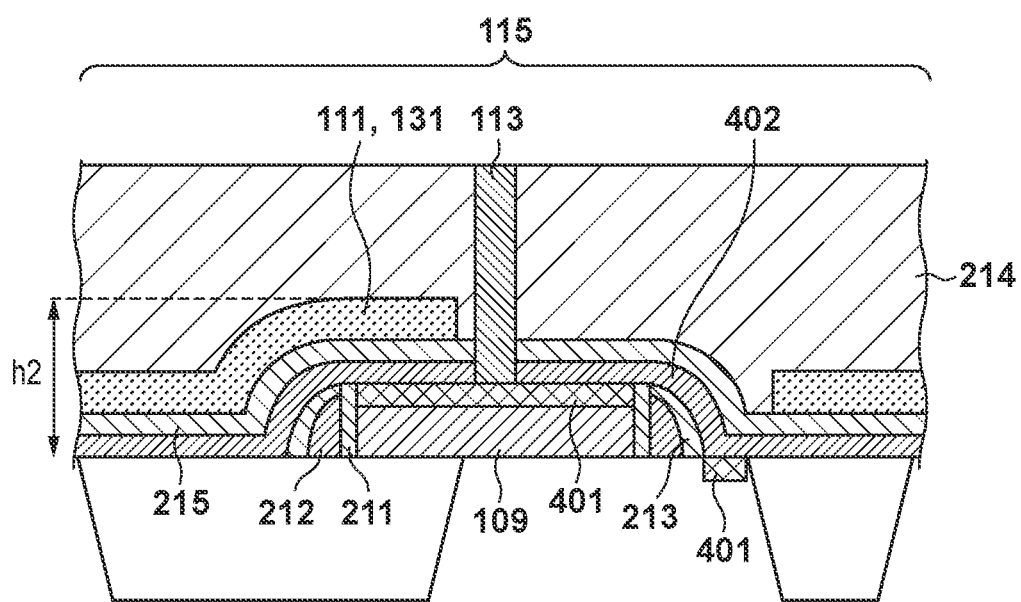
FIG. 2B is a sectional view showing an arrangement example of a peripheral region of the photoelectric conversion apparatus shown in FIGS. 1A and 1B.

In addition, as shown in FIGS. 1A and 1B, the respective elements in the pixel region 114 and the peripheral region 115 are inactive regions, and are electrically isolated by, for example, an element isolation portion 116 filled with an insulator. The photoelectric conversion apparatus 100 will be further described below in detail with reference to FIGS. 1A to 2B. FIG. 2A is an enlarged sectional view taken along a line G-G' shown in FIG. 1A, and FIG. 2B is an enlarged sectional view taken along a line S-S' shown in FIG. 1A.

The photoelectric conversion portion 101 provided in the substrate 200 using a semiconductor such as silicon is, for example, an n-type semiconductor region, and has a buried photodiode structure by forming, for example, a p-type semiconductor region 201 in the upper portion of the photoelectric conversion portion 101. With this structure, noise generated on the surface of the substrate can be suppressed. The charge holding portion 102 may also be an n-type semiconductor region similar to the photoelectric conversion portion 101, and have a buried structure by forming a p-type semiconductor region 202 in the upper portion of the charge holding portion 102.

The charges accumulated in the charge holding portion 102 are transferred to the FD 103 by turning on the transistor 105. The charges transferred to the FD 103 are input to the gate electrode of the transistor 106 via the contact plug 113 and the wiring pattern 216, and converted into a voltage signal.

An OFD 203 is arranged adjacent to the photoelectric conversion portion 101. When the transistor 108 is turned on, the charges accumulated in the photoelectric conversion portion 101 are discharged to the OFD 203. By causing all the pixels PIX to remove charges to the respective OFDs 203 at the same time and then transferring charges accumulated in the photoelectric conversion portion 101 to the charge holding portion 102, an electronic shutter (global electronic shutter) that sets the same and constant exposure time with respect to all pixels is implemented. This suppresses a shift in exposure timing generated when sequentially reading out charges from the pixels PIX, so that an image distortion is reduced. Thus, this embodiment is suitable for a CMOS image sensor having the global electronic shutter function.

The pixel PIX may include an antireflection film formed by stacking, for example, silicon oxide 211 and silicon nitride 212 on the photoelectric conversion portion 101 as shown in FIG. 2A. As will be described in detail later, silicon oxide that functions as a protective film 213 of a silicide layer 401 formed in the peripheral region 115 may be arranged on the antireflection film.

Further, as a light shielding portion that covers immediately above the charge holding portion 102, a metal layer 111 is arranged between the interlayer insulating film 214 and the substrate 200 and on the protective film 213. The metal layer 111 is arranged so as to cover at least the charge holding portion 102 and the electrode pattern (gate electrode) of the transistor 104. The metal layer 111 suppresses entry of light to the charge holding portion 102. This suppresses noise generated when charges are generated in the charge holding portion 102 due to light entering there while the charge holding portion 102 is holding charges transferred from the photoelectric conversion portion 101. In order to prevent the influence of stray light, the metal layer 111 is arranged immediately above the charge holding portion 102 and closer to the substrate 200 than the wiring patterns 216, 218, and 220.

The metal layer 111 is configured to include at least one pattern, typically two or more patterns, mainly formed by one film formation and one patterning. One pattern indicates that the entire one pattern is surrounded by the entire circumference of the side surface of the one pattern. In this embodiment, the metal layer 111 can separately include a pattern 121 arranged in the pixel region 114 and a pattern 131 arranged in the peripheral region 115. That is, the side surface of the pattern 121 surrounds the pattern 121 but does not surround the pattern 131. As shown in FIG. 1A, the pattern 121 and the pattern 131 are arranged apart from each other, and their potentials can be controlled separately. Note that the pattern 121 and the pattern 131 may be continuous with each other to form one pattern.

In the pixel region 114, the pattern 121 of the metal layer 111 is arranged so as to cover the charge holding portion 102. In addition, the pattern 121 of the metal layer 111 is arranged so as to cover at least a part of each of the gate electrodes of the transistors 104 and 105 included in the electrically conductive layer. In other words, in the pixel region 114, the metal layer 111 covers at least a part of the electrically conductive layer that includes the pattern forming the gate electrode of the pixel transistor. As has been described above, when the photoelectric conversion portion 101 is the n-type semiconductor region, it can be said that the pattern 121 included in the metal layer 111 arranged in the pixel region 114 covers the gate electrode of the NMOS transistor. On the other hand, since the photoelectric conversion portion 101 needs to be irradiated with light, the metal layer 111 has an opening directly above the photoelectric conversion portion 101. However, the metal layer 111 may partially extend to the end portion of the photoelectric conversion portion 101. Further, as shown in FIGS. 1A and 1B, the pattern 121 of the metal layer 111 may have openings other than a portion above the photoelectric conversion portion 101. The pattern 121 of the metal layer 111 may cover most of the pixel region 114 a portion above the photoelectric conversion portion 101. In this case, similar to the pattern 131 arranged in the peripheral region 115 shown in FIGS. 1A and 1B, which will be described later, the pattern 121 may include an opening 112 so as not to contact the contact plug 113 for electrically connecting the wiring pattern 216 and the electrically conductive layer including the electrode pattern (for example, the gate electrode) of the transistor 104 and the like. By providing the opening 112, the pattern 121 of the metal layer 111 can surround the contact plug 113.

For the metal layer 111, for example, a material containing a metal such as tungsten, tungsten silicide, tungsten oxide, or aluminum that hardly transmits visible light is used. The metal layer 111 may be an alloy film containing the above-described metal or the like. The film thickness of the metal layer 111 may be, for example, about 100 to 200 nm. An adhesion layer 215 formed by a silicon oxide film or the like may be arranged between the metal layer 111 and the silicon nitride 212. The above-described silicon oxide protective film 213 may function as the adhesion layer. As has been described above, the metal layer 111 is collectively formed in a portion where the gate electrodes of the pixel transistors (for example, the transistors 104 and 105) on the substrate 200 are arranged and a portion where no gate electrode is arranged. Therefore, the upper surface of the metal layer 111 has unevenness according to the film thickness of the pattern forming the gate electrode.

The pattern 121 included in the metal layer 111 arranged in the pixel region 114 may be electrically insulated from the electrode pattern which is included in the electrically conductive layer and forms the gate electrode of the pixel transistor. On the other hand, for potential stabilization, the pattern 121 included in the metal layer 111 arranged in the pixel region 114 may be connected to the substrate 200 by a connection portion 117 formed by a contact plug different from the above-described contact plug 113. Alternatively, the pattern 121 included in the metal layer 111 arranged in the pixel region 114 may be electrically connected to the substrate 200 via the connection portion 117 that forms ohmic contact between the surface of the metal layer 111 on the substrate 200 side and the surface of the substrate 200 on the metal layer 111 side.

On each pixel PIX, the interlayer insulating film 214, the wiring patterns 216, 218, and 220 for controlling the pixel transistors and transmitting signals, the contact plug 113, vias 217 and 219, and the like are arranged. The interlayer insulating film 214 is formed of, for example, silicon oxide or the like. For the wiring patterns 216, 218 and 220, the contact plug 113, and the vias 217 and 219, for example, an electrically conductive material containing a metal such as aluminum, copper, or an alloy thereof is used. A barrier metal layer for preventing metal diffusion may be further arranged at the boundary between each of the wiring patterns 216, 218, and 220, the contact plug 113, and the vias 217 and 219 and the interlayer insulating film 214.

Each pixel PIX may further include an in-layer lens 222 as an optical system arranged directly above the photoelectric conversion portion 101. The in-layer lens 222 is formed of, for example, silicon nitride, and an antireflection film 221 formed of, for example, silicon oxynitride or the like may be arranged between the interlayer insulating film 214 and the in-layer lens 222. Further, an antireflection film 223 formed of silicon oxynitride or the like may be arranged above the in-layer lens. By adopting such an antireflection structure, the transmittance of incident light can be improved and the sensitivity can be improved. Furthermore, a planarized film 224, a color filter 225, a microlens 226, and the like may be arranged above the in-layer lens 222. The planarized film 224, the color filter 225, and the microlens 226 can be formed of, for example, a resin or the like.

In the pixel region 114, the metal layer 111 can be arranged except the openings in the vicinity of the photoelectric conversion portion 101 and the contact plug 113. On the other hand, in the peripheral region 115, it is less necessary to prevent light from entering each of the arranged elements. However, in the pixel region 114 and the peripheral region 115, due to the presence/absence of the metal layer 111, a physical level difference or a difference in optical reflectance occurs between the regions. In order to suppress the occurrence of the level difference or the reflectance difference, in this embodiment, the pattern 131 included in the metal layer 111 is arranged in the peripheral region 115 excluding the region in the vicinity of the contact plug 113. That is, in the peripheral region 115, the pattern 131 of the metal layer 111 covers at least the upper surface of the electrically conductive pattern included in the above-described electrically conductive layer. In other words, in orthographic projection to the substrate 200, the pattern 131 of the metal layer 111 arranged in the peripheral region 115 is arranged at a position overlapping at least a part of the electrically conductive pattern. Here, the pattern included in the electrically conductive layer arranged in the peripheral region 115 is particularly referred to as an electrically conductive pattern. For example, the pattern 131 of the metal layer 111 covers at least the upper surface of the electrically conductive pattern which is included in the electrically conductive layer and forms the gate electrodes of the plurality of transistors including the peripheral transistors 109 and 110 arranged in the peripheral region 115. Regardless of the arrangement of the peripheral transistors 109 and 110 and the arrangement of the element isolation portion 116, the metal layer 111 is provided with the opening 112 so as not to contact the contact plug 113. By providing the opening 112, the pattern 131 of the metal layer 111 can surround the contact plug 113. Further, so as to have a height equal to the height in the pixel region 114, the pattern 131 included in the metal layer 111 can be arranged above the electrically conductive pattern which is included in the electrically conductive layer and forms the gate electrodes of the plurality of transistors arranged in the peripheral region 115. In the peripheral region 115, not only an NMOS transistor but also a PMOS transistor is arranged, as in a CMOS circuit or the like. Therefore, the pattern 131 included in the metal layer 111 arranged in the peripheral region 115 can cover not only the gate electrode of the NMOS transistor but also the gate electrode of the PMOS transistor.

In the peripheral region 115, the electrically conductive layer can include a dummy pattern 119 in addition to the gate electrodes of the peripheral transistors 109 and 110. The dummy pattern 119 can be an electrically conductive pattern which is included in the electrically conductive layer and in which the entire circumference of the side surface of the pattern is arranged on the insulator of the element isolation portion 116. As shown in FIG. 1A, the pattern 131 included in the metal layer 111 arranged in the peripheral region 115 may be arranged so as to cover the dummy pattern 119.

A plurality of the contact plugs 113 connected to the wiring patterns 216, 218, and 220 may be included in one opening 112 provided in the metal layer 111. Also in the peripheral region 115, the metal layer 111 is collectively formed in a portion where the gate electrodes of the plurality of transistors arranged in the peripheral region 115 are arranged and a portion where no gate electrode is arranged. Therefore, the upper surface of the metal layer 111 has unevenness according to the film thickness of the pattern forming the gate electrode.

Similar to the pattern 121, the pattern 131 included in the metal layer 111 arranged in the peripheral region 115 may be electrically insulated from the electrically conductive pattern which is included in the electrically conductive layer and forms the gate electrodes of the peripheral transistors. In this case, for potential stabilization, the pattern 131 included in the metal layer 111 arranged in the peripheral region 115 may be connected to the substrate 200 by a contact plug 118 different from the above-described contact plug 113. The contact plug 118 may electrically connect the surface of the metal layer 111 on the substrate 200 side and the surface of the substrate 200 on the metal layer 111 side, for example. In this case, for example, the pattern 121 included in the metal layer 111 may be supplied with an analog ground potential corresponding to the pixel transistors, and the pattern 131 included in the metal layer 111 may be supplied with a digital ground potential corresponding to the peripheral transistors 109 and 110. That is, for each of the patterns 121 and 131, the metal layer 111 may be fixed at a predetermined or constant potential while the photoelectric conversion apparatus 100 is operating. Alternatively, a common ground potential may be supplied to the patterns 121 and 131 of the metal layer 111. That is, the metal layer 111 may be fixed at a predetermined or constant potential while the photoelectric conversion apparatus 100 is operating.

Further, the pattern 131 included in the metal layer 111 arranged in the peripheral region 115 may be electrically connected to the electrically conductive pattern which is included in the electrically conductive layer and forms the gate electrodes of the peripheral transistors 109 and 110. In this case, each of the peripheral transistors 109 and 110 may be, for example, a CMOS circuit, an SRAM cell, or the like. The pattern 131 may function as a local wiring pattern of the CMOS circuit, the SRAM cell, or the like. The pattern 131 as the local wiring pattern can connect the first transistor and the second transistor included in the CMOS circuit, the SRAM cell, or the like to each other. The pattern 131 can connect, for example, the gate electrode of the first transistor and the gate electrode of the second transistor included in the CMOS circuit, the SRAM cell, or the like. Alternatively, the pattern 131 can connect the gate electrode of the first transistor and the source or drain of the second transistor included in the CMOS circuit, the SRAM cell, or the like. Alternatively, the pattern 131 can connect the source or drain of the first transistor and the source or drain of the second transistor included in the CMOS circuit, the SRAM cell, or the like. In the CMOS circuit, one of the first transistor and the second transistor is an NMOS transistor and the other is a PMOS transistor. However, both the first transistor and the second transistor may be NMOS transistors to which the pattern 131 as the local wiring pattern is connected. Further, both the first transistor and the second transistor may be PMOS transistors to which the pattern 131 as the local wiring pattern is connected. In order to use the pattern 131 included in the metal layer 111 as the local wiring pattern, the metal layer 111 may use tungsten. Further, the pattern 131 included in the metal layer 111 may be electrically connected to the dummy pattern 119 as shown in FIG. 1A. In these cases, the pattern 131 included in the metal layer 111 arranged in the peripheral region 115 may be electrically connected to the electrically conductive pattern via a plug between the surface of the metal layer 111 on the substrate 200 side and the surface, on the metal layer 111 side, of the electrically conductive pattern including the gate electrodes of the peripheral transistors 109 and 110 and the dummy pattern 119. The pattern 131 included in the metal layer 111 arranged in the peripheral region 115 is less required to function as the light shielding portion as described above. Therefore, it is possible to set the pattern arrangement in which the electrical conductivity of the metal layer 111 can be used, as needed. The pattern 131 in the peripheral region 115 can be connected to the gate electrodes of the peripheral transistors 109 and 110 and the dummy pattern 119 included in the electrically conductive layer by contact plugs or the like.

As shown in FIG. 2A, in the pixel region 114, as has been described above, the metal layer 111 (the pattern 121) is arranged on a stacked film of the silicon oxide 211 and the silicon nitride 212, which function as the antireflection film, the protective film 213, and the adhesion layer 215. The protective film 213 and the adhesion layer 215 may have a stacked structure, or either one of them may be arranged. As has been described above, the protective film 213, the adhesion layer 215, and the interlayer insulating film 214 are formed of silicon oxide in this embodiment. As shown in FIG. 2B, in the peripheral region 115, the sidewall of each of the gate electrodes of the peripheral transistors 109 and 110 and the dummy pattern 119 is formed using the silicon oxide 211, the silicon nitride 212, and silicon oxide as the protective film 213. In addition, the silicide layer 401 is formed in the active region excluding the element isolation portion 116, and at least a partial region on each of the gate electrodes of the peripheral transistors 109 and 110 and the dummy pattern 119. Therefore, in the peripheral region 115, the electrically conductive pattern which is included in the electrically conductive layer and forms the gate electrodes of the peripheral transistors 109 and 110, the dummy pattern 119, and the like covered by the pattern 131 of the metal layer 111 can include the silicide layer 401. The upper surfaces of the gate electrodes of the peripheral transistors 109 and 110 covered by the pattern 131 can be formed by the silicide layer 401. The side surfaces of the gate electrodes of the peripheral transistors 109 and 110 covered by the pattern 131 can be mainly formed by a polysilicon layer. Further, in the peripheral region 115, the electrically conductive pattern of each of the peripheral transistors 109 and 110 included in the electrically conductive layer covered by the pattern 131 included in the metal layer 111 can be the gate electrode of the transistor including the silicide layer 401 in the active region as the source or drain region. On the other hand, in the pixel region 114, the electrode pattern which is included in the electrically conductive layer and forms the gate electrode of the transistor 104 or the like covered by the pattern 121 included in the metal layer 111 may not include the silicide layer 401. That is, the silicide layer 401 may not be arranged on the pixel transistor.

Silicon nitride 402, which functions as an etching stop film when a hole is formed upon forming the protective film of the silicide layer 401 and the contact plug 113, is arranged on the silicide layer 401. Further, the adhesion layer 215 using silicon oxide is formed, and the metal layer 111 is formed thereon. Since no photoelectric conversion portion 101 exists unlike in the pixel region 114, the arrangement of the metal layer 111 only needs to be designed to be provided with the opening 112 which does not contact the electrically unconnected contact plug 113. In addition, the metal layer 111 is arranged such that the height from the surface of the substrate 200 to the upper surface of the portion of the metal layer 111 arranged on the pattern forming the gate electrode of the pixel transistor is equal to the height from the surface of the substrate 200 to the upper surface of the portion of the metal layer 111 arranged on the pattern forming the gate electrodes of the plurality of transistors in the peripheral region 115. That is, the metal layer 111 is arranged in a partial region on the pattern of the gate electrode of the transistor in the peripheral region 115 such that a height h1 from the substrate 200 to the upper surface of the metal layer 111 shown in FIG. 2A is almost equal to a height h2 from the surface of the substrate 200 to the upper surface of the metal layer 111 shown in FIG. 2B.

Next, steps of forming the photoelectric conversion apparatus 100 in this embodiment will be described with reference to FIGS. 3A to 6B. Similar to FIGS. 2A and 2B, each of FIGS. 3A to 6B shows a cross section taken along the line G-G' or the line S-S' shown in FIG. 1A.

Figure 3A:
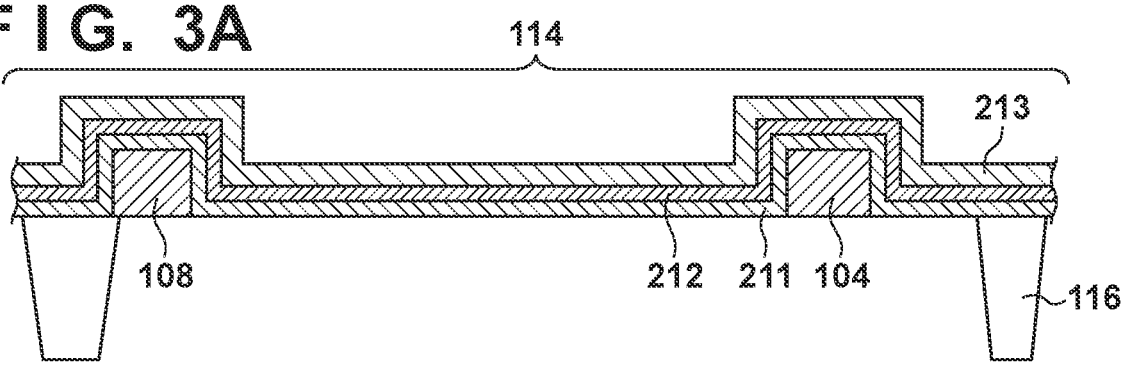
FIGS. 3A to 3D are sectional views showing a manufacturing method of the photoelectric conversion apparatus shown in FIGS. 1A and 1B.
Figure 3B:
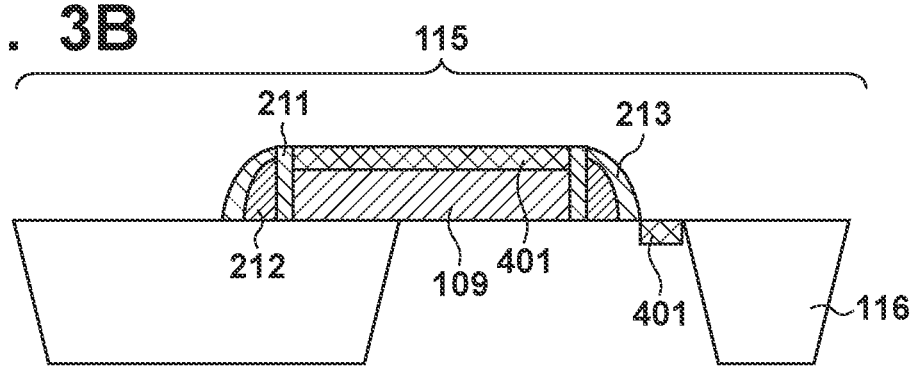

First, the element isolation portion 116 is formed in the substrate 200 using silicon. Then, the gate of the transistor including the gate insulating film and the gate electrode is formed. The electrode pattern including the gate electrodes of pixel transistors (including the transistors 104, 105, 106, 107 and 108 described above) arranged in the pixel region 114 and the electrically conductive pattern including the gate electrodes of the peripheral transistors 109 and 110 and the dummy pattern 119 arranged in the peripheral region 115, the both patterns being included in the electrically conductive layer, are formed using, for example, polysilicon. That is, the electrode pattern and the electrically conductive pattern forming the gate electrodes of the transistors and the like formed on the substrate 200 may be made of a material different from that of the wiring patterns 216, 218, and 220 and the contact plug 113, which are made of a metal such as aluminum or copper. Subsequently, by impurity implantation, the photoelectric conversion portion 101, the charge holding portion 102, the FD 103, the source/drain regions of the transistors arranged in the pixel region 114 and the peripheral region 115, and the like are formed. After that, the silicon oxide 211 and the silicon nitride 212 are deposited as the antireflection film in the pixel region 114 and as the sidewalls of the gate electrodes in the peripheral region 115. Further, silicon oxide is deposited as the protective film 213 in a region where silicide is not formed. Then, a photolithography step and a dry etching step are performed to form a pattern such that the silicon oxide 211, the silicon nitride 212, and the protective film 213 remain at least in the pixel region 114. The silicon nitride 212 in the pixel region 114 can also have a function as an etching stop film when a hole is formed upon forming the contact plug 113. In the peripheral region 115, sidewalls are formed on the gate electrodes of the respective transistors. Thereafter, a metal such as cobalt or nickel is deposited and annealing is performed thereon to form the silicide layer 401 above the substrate 200 in at least a part of the peripheral region 115. A sectional view of the pixel region 114 and a sectional view of the peripheral region 115 at this time are shown in FIGS. 3A and 3B, respectively.

Figure 3C:
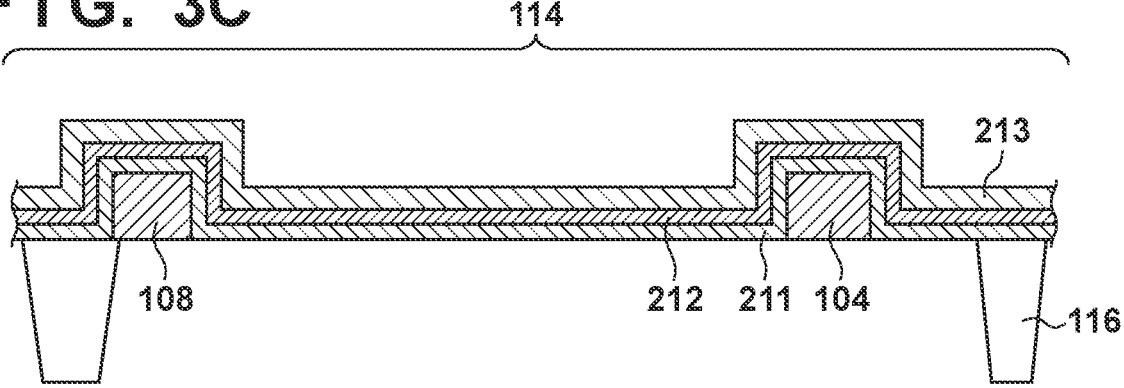
Figure 3D:
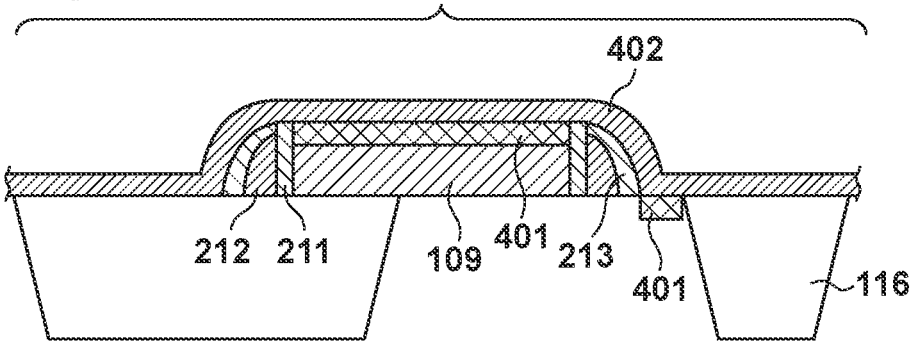
Figure 4A:
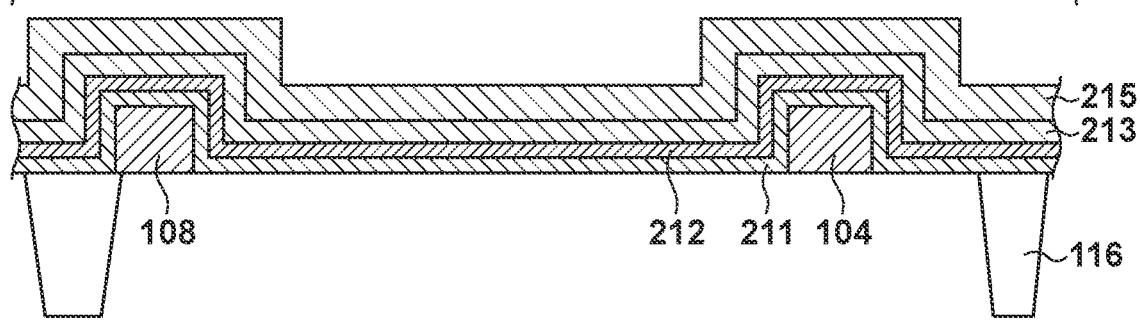
FIGS. 4A to 4D are sectional views showing the manufacturing method of the photoelectric conversion apparatus shown in FIGS. 1A and 1B.
Figure 4B:
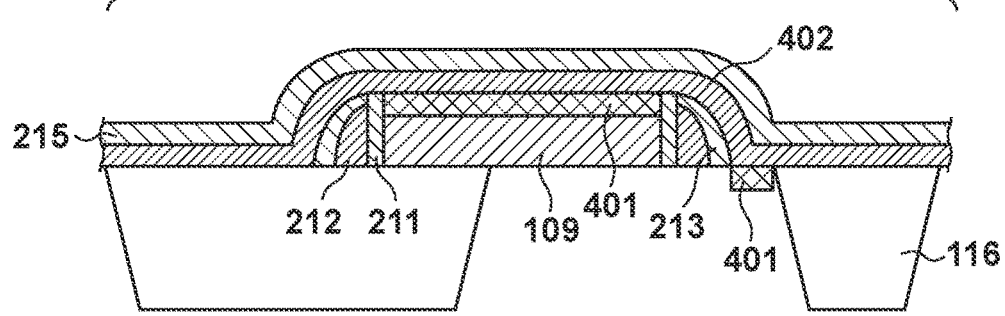

Next, the silicon nitride 402 is deposited as an etching stop film upon forming a contact hole in the peripheral region 115. Then, a mask pattern is formed such that the silicon nitride 402 remains only in the peripheral region 115, and the silicon nitride 402 in the pixel region 114 is removed using dry etching or the like. Sectional views at this time are shown in FIG. 3C (the pixel region 114) and FIG. 3D (the peripheral region 115). After the silicon nitride 402 deposited on the pixel region 114 is removed, the adhesion layer 215 is deposited as shown in FIG. 4A (the pixel region 114) and FIG. 4B (the peripheral region 115).

Figure 4C:
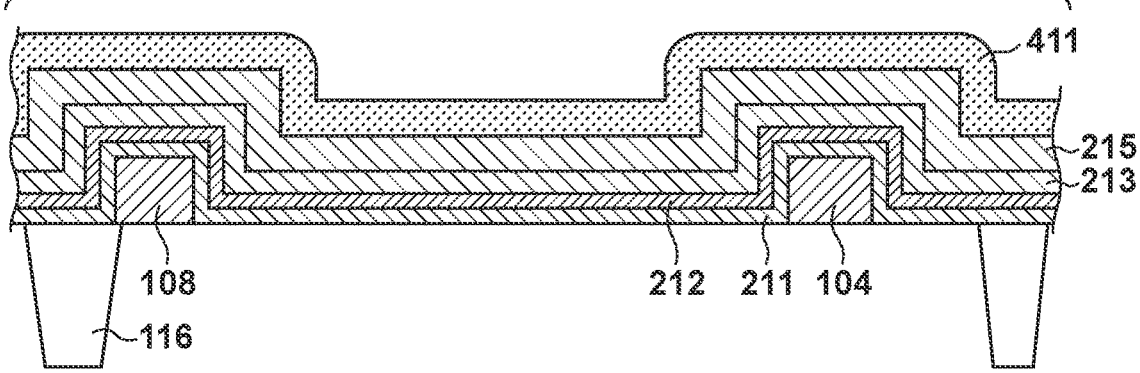
Figure 4D:
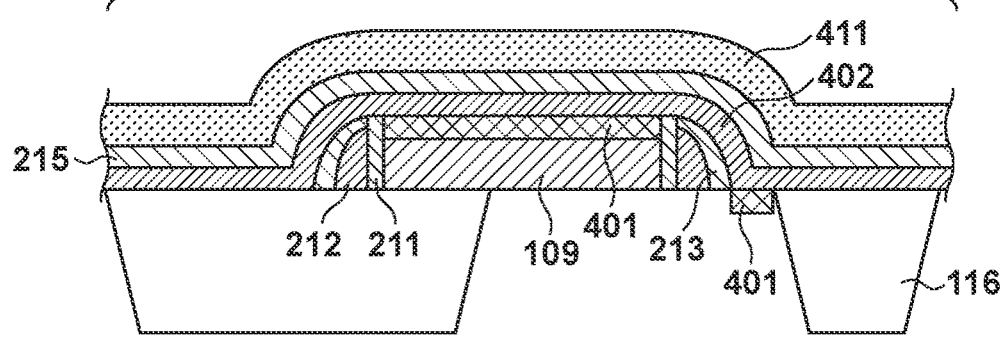
Figure 5A:
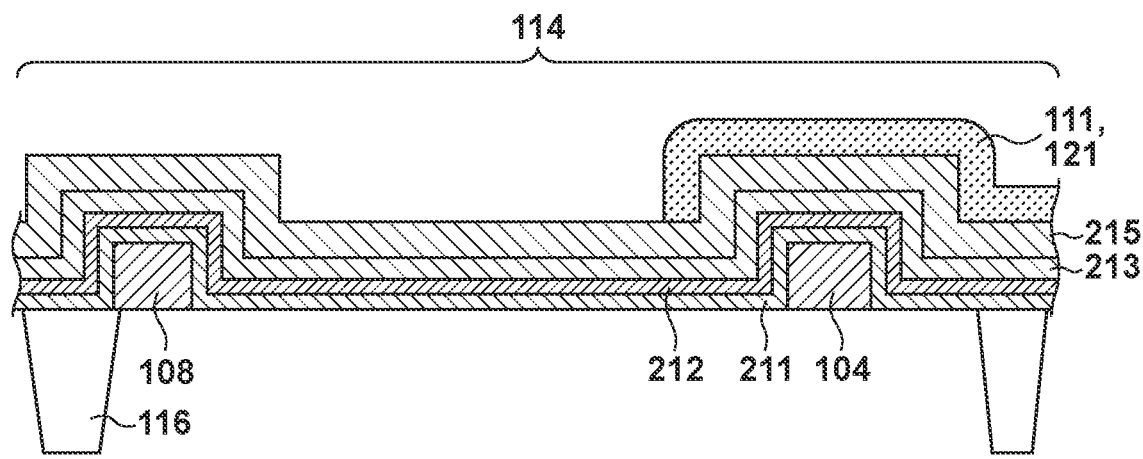
FIGS. 5A and 5B are sectional views showing the manufacturing method of the photoelectric conversion apparatus shown in FIGS. 1A and 1B.
Figure 5B:
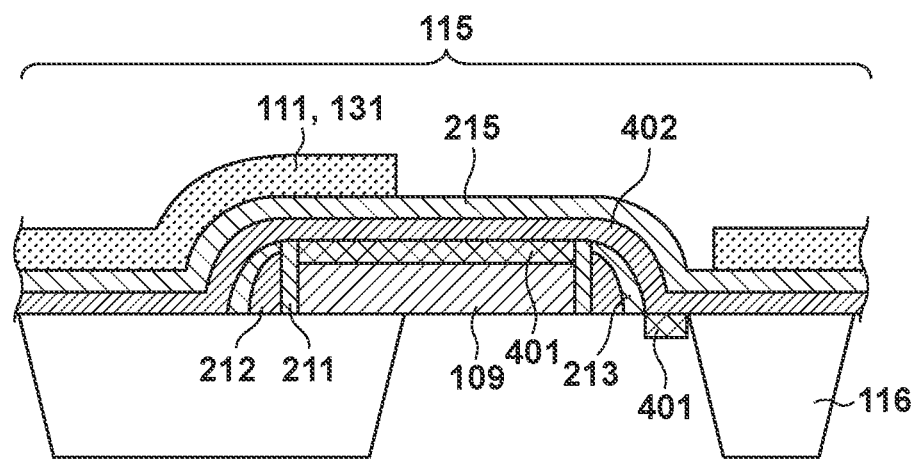

After the adhesion layer 215 is formed, as shown in FIG. 4C (the pixel region 114) and FIG. 4D (the peripheral region 115), a metal film 411 to be the metal layer 111 is deposited using a sputtering method or the like. After the metal film 411 is formed, a photolithography step and a dry etching step are performed. Thus, in the pixel region 114, the pattern 121 including the openings above the photoelectric conversion portion 101 and in a location where the contact plug 113 is formed in a subsequent step is formed. Further, in the peripheral region 115, the pattern 131 including the opening 112 in a location where the electrically unconnected contact plug 113 is formed in a subsequent step is formed. Thus, the metal layer 111 is formed. At this time, in the peripheral region 115, the metal layer 111 can be arranged at an appropriate position in accordance with the electrically unconnected contact plug 113, regardless of the arrangement of the peripheral transistors 109 and 110 and the dummy pattern 119 and the arrangement of the element isolation portion 116. In addition, the pattern 131 arranged in the peripheral region 115 included in the metal layer 111 in the peripheral region 115 is arranged above the electrically conductive pattern which is included in the electrically conductive layer and forms at least a part of each of the gate electrodes of the transistors including the peripheral transistors 109 and 110 and the dummy pattern 119. Thus, the height from the surface of the substrate 200 to the upper surface of the metal layer 111 becomes equal to that in the pixel region 114. Sectional views at this time are shown in FIG. 5A (the pixel region 114) and FIG. 5B (the peripheral region 115).

Figure 6A:
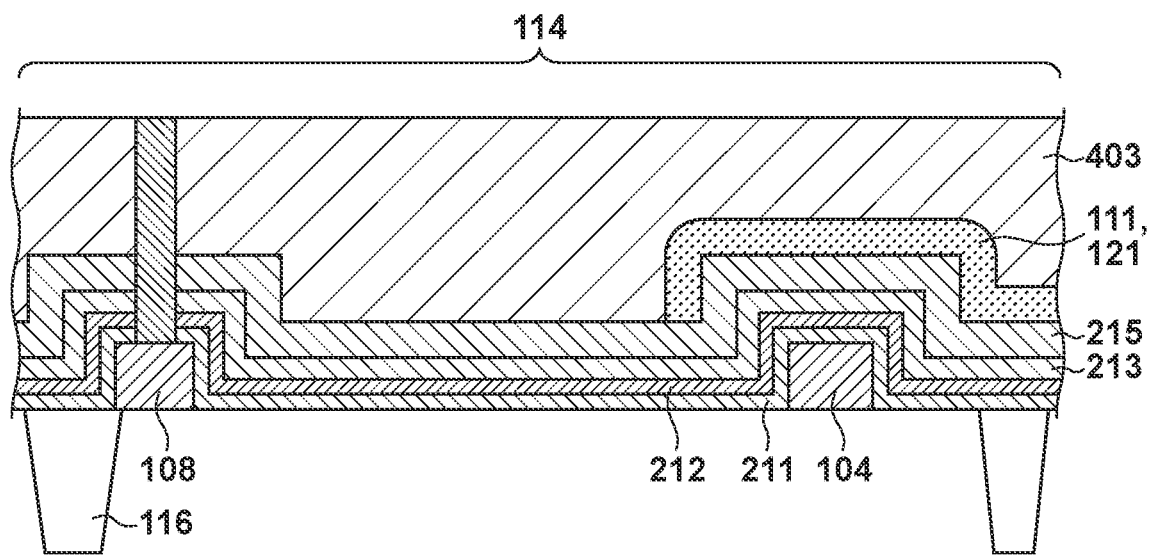
FIGS. 6A and 6B are sectional views showing the manufacturing method of the photoelectric conversion apparatus shown in FIGS. 1A and 1B.
Figure 6B:
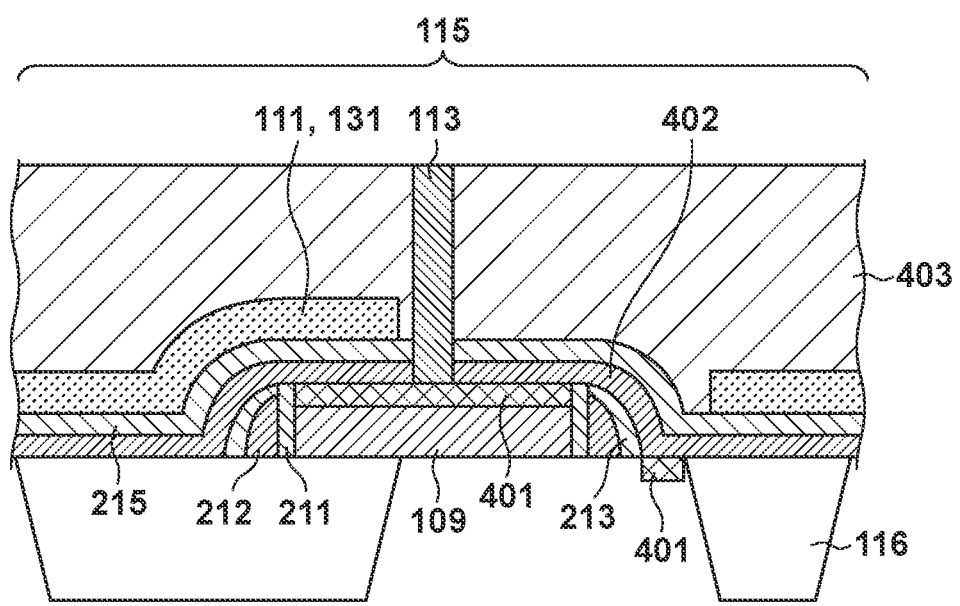

Next, as shown in FIG. 6A (the pixel region 114) and FIG. 6B (the peripheral region 115), the contact plugs 113 are formed. First, an insulating film 403 which becomes a part of the interlayer insulating film 214 is deposited and the surface is planarized using a method such as chemical mechanical polishing. Then, using a photolithography step, a mask pattern including an opening in a location where the contact plug 113 is to be formed is formed. At this time, if the metal layer 111 (the pattern 131) does not exist in the peripheral region 115, the height from the surface of the substrate 200 to the surface of the insulating film 403 is different between the pixel region 114 in which the metal layer 111 (the pattern 121) exists and the peripheral region 115 in which the metal layer 111 does not exist. More specifically, even if the surface of the insulating film 403 is planarized using a method such as chemical mechanical polishing or etch back, the height of the surface of the insulating film in the pixel region 114 in which the metal layer 111 exists becomes larger than the height of the surface of the insulating film 403 in the peripheral region 115 in which the metal layer 111 does not exist. Therefore, defocus can occur in the photolithography step for forming the mask pattern. Further, in the photolithography step, a difference in optical reflectance occurs due to the presence/absence of the metal layer 111. That is, the margin in setting the exposure conditions upon forming the mask pattern becomes small. Further, when the contact hole for forming the contact plug 113 is formed, since the thickness from the substrate 200 to the surface of the insulating film 403 is different between the pixel region 114 and the peripheral region 115, a difference in etching time occurs, resulting in a small margin in processing. On the other hand, in this embodiment, the metal layer 111 (the pattern 131) is also arranged in the peripheral region 115. This suppresses the problems as described above. Thus, various types of patterns can be appropriately formed in respective steps of forming layers above the metal layer 111. As a result, it becomes possible to improve the manufacturing yield of the photoelectric conversion apparatus in which the metal layer is arranged, and to implement the photoelectric conversion apparatus having the performance more based on the design. Therefore, the degree of freedom in process and design can be increased.

The arrangement and manufacturing method of a photoelectric conversion apparatus according to the second embodiment will be described with reference to FIGS. 7A to 8D. This embodiment is different from the first embodiment described above in that the thickness from the lower surface of an adhesion layer 215 to a metal layer 111 (a pattern 131) in a peripheral region 115 is larger than the thickness from the lower surface of the adhesion layer 215 to the metal layer 111 (a pattern 121) in a pixel region 114. The structure of a photoelectric conversion apparatus 100 other than this may be similar to that of the first embodiment described above. Therefore, the points different from the first embodiment described above will be mainly described below.

Figure 7A:
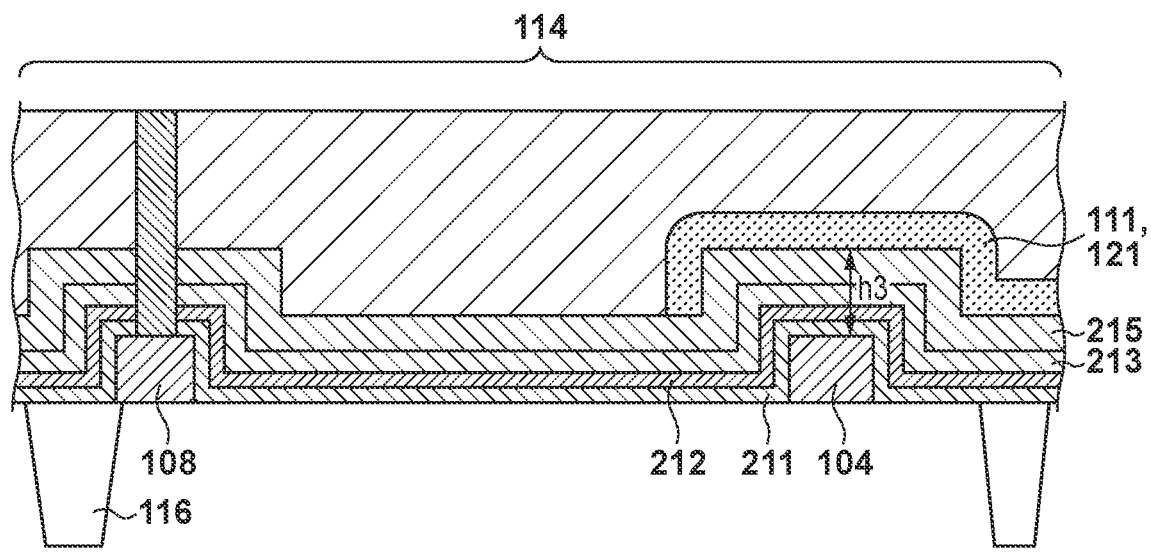
FIG. 7A is a sectional view showing another arrangement example of the pixel region of the photoelectric conversion apparatus shown in FIGS. 1A and 1B.
Figure 7B:
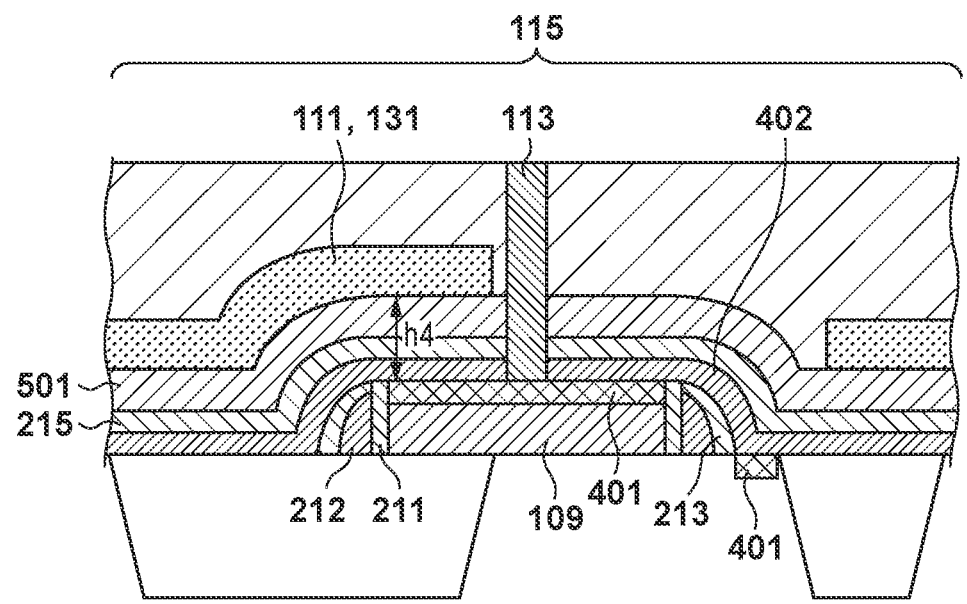
FIG. 7B is a sectional view showing another arrangement example of the peripheral region of the photoelectric conversion apparatus shown in FIGS. 1A and 1B.

FIGS. 7A and 7B are sectional views taken along the line G-G' and the line S-S' shown in FIG. 1A according to this embodiment, respectively. In this embodiment, the sectional structure of the pixel region 114 shown in FIG. 7A is similar to the structure shown in FIG. 2A described above. On the other hand, the peripheral region 115 includes a two-layer structure of the adhesion layer 215 and an insulating layer 501 below the metal layer 111, and the thickness from the adhesion layer 215 to the metal layer 111 is formed larger than that in the pixel region 114.

In general, in the pixel region 114, the metal layer 111 can be arranged in a region other than a photoelectric conversion portion 101. On the other hand, in the peripheral region 115, since control/signal processing circuits such as peripheral transistors 109 and 110 are formed, the transistor formation density is high and the number of contact plugs 113 increases accordingly. Therefore, the peripheral region 115 can have a smaller area in which the metal layer 111 can be arranged than the pixel region 114.

In orthographic projection to a substrate 200, the above-described effect is enhanced when the coverage of the metal layer 111 in the pixel region 114 is equal to the coverage of the metal layer 111 in the peripheral region 115. However, as an example, the coverage of the metal layer 111 in the peripheral region 115 is limited to about 80% of that in the pixel region 114. When the coverage of the metal layer 111 in the peripheral region 115 is decreased, the height from the substrate 200 to the surface of an insulating film 403 as described above can be relatively larger in the pixel region 114. On the other hand, an increase in coverage of the metal layer 111 in the peripheral region 115 may cause a problem of a parasitic capacitance between the metal layer and the wiring pattern or the gate electrode.

Accordingly, in this embodiment, the insulating layer 501 for adjusting the height is formed in addition to the adhesion layer 215 below the metal layer 111 in the peripheral region 115. This makes it possible to suppress a level difference between the peripheral region and the pixel region 114 even when the coverage is decreased. When the insulating layer 501 is of the same film type as the adhesion layer 215, the adhesion layer 215 may be formed thick and a part of the adhesion layer 215 in the pixel region 114 may be etched. In this case, the insulating layer 501 may not be deposited. By forming the insulating layer 501, the height from the upper surface of an electrically conductive pattern which is included in the electrically conductive layer and forms the gate electrodes of a plurality of transistors including the peripheral transistors 109 and 110 and a dummy pattern 119 in the peripheral region 115 to a portion of the metal layer 111 arranged above the pattern forming the gate electrodes of the plurality of transistors becomes larger than the height from the upper surface of an electrode pattern which is included in the electrically conductive layer and forms the gate electrode of a pixel transistor such as a transistor 104 as described above to a portion of the metal layer 111 arranged above the electrode pattern forming the gate electrode of the pixel transistor. That is, it is possible to make a distance h4 from the surface of the gate electrode of the peripheral transistor 109 to the lower surface of the metal layer 111 above the gate electrode pattern shown in FIG. 7B larger than a distance h3 from the surface of the gate electrode of the transistor 104 to the lower surface of the metal layer 111 above the gate electrode pattern shown in FIG. 7A. As a result, the height from the surface of the substrate 200 to the upper surface of the portion of the metal layer 111 arranged on the pattern forming the gate electrode of the pixel transistor arranged in the pixel region 114 can be smaller than the height from the surface of the substrate 200 to the upper surface of the portion of the metal layer 111 arranged above the pattern forming the gate electrodes of the plurality of transistors arranged in the peripheral region 115. Thus, even when the coverage of the metal layer 111 (the pattern 131) in the peripheral region 115 with respect to the coverage of the metal layer 111 (the pattern 121) in the pixel region 114 is decreased, the above-described effect of suppressing the level difference can be obtained. Further, in the peripheral region 115, by arranging the metal layer 111 above the gate electrodes of the peripheral transistors 109 and 110 or above the wiring pattern, a parasitic capacitance is generated between the gate electrode or the wiring pattern and the metal layer 111. However, by arranging the insulating layer 501 in the peripheral region 115, relaxation of the parasitic capacitance is implemented. At this time, since the insulating layer 501 is arranged only in the peripheral region 115, the thickness of the adhesion layer 215 in the pixel region 114 does not change, so the light shielding performance of the metal layer 111 is not affected.

The inventors and the like have confirmed by experiments that, by forming the insulating layer 501 in the peripheral region 115, the effect of suppressing the level difference between the regions was obtained even when the coverage of the metal layer 111 in the peripheral region 115 was about 30% of the coverage of the metal layer 111 in the pixel region 114. That is, in orthographic projection to the substrate 200, when the coverage of the metal layer 111 (the pattern 121) in the pixel region 114 is A and the coverage of the metal layer 111 (the pattern 131) in the peripheral region 115 is B, B/A≥0.3 may be set. Further, also in the above-described first embodiment in which the insulating layer 501 is not formed, even under a condition in which the coverage of the metal layer 111 in the peripheral region 115 was about 30% of the coverage of the metal layer 111 in the pixel region 114, the larger effect can be obtained than in a case in which no metal layer 111 was arranged. That is, the effect of the metal layer 111 can be obtained when the coverage of the metal layer 111 in the peripheral region 115 is 30% or more of the coverage of the metal layer 111 in the pixel region 114. Furthermore, by introducing the insulating layer 501, not only the effect of suppressing the level difference between the regions is obtained but also the problem of a parasitic capacitance can be suppressed.

Figure 8A:
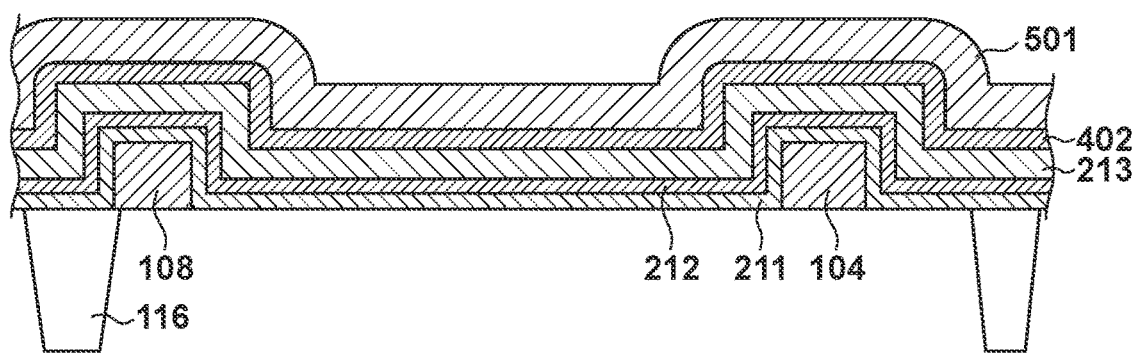
FIGS. 8A to 8D are sectional views showing another manufacturing method of the photoelectric conversion apparatus shown in FIGS. 1A and 1B.
Figure 8B:
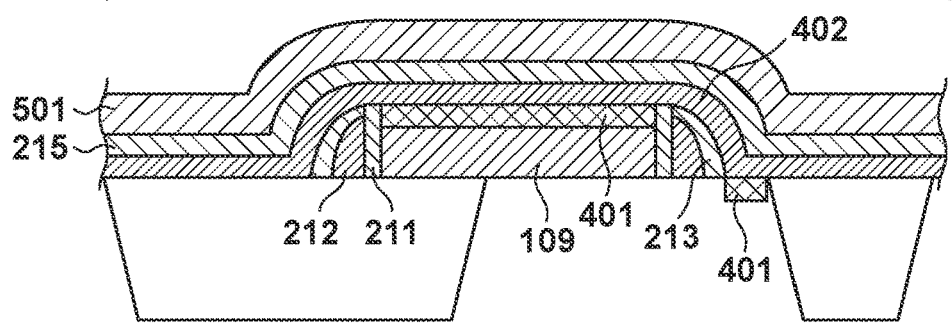
Figure 8C:
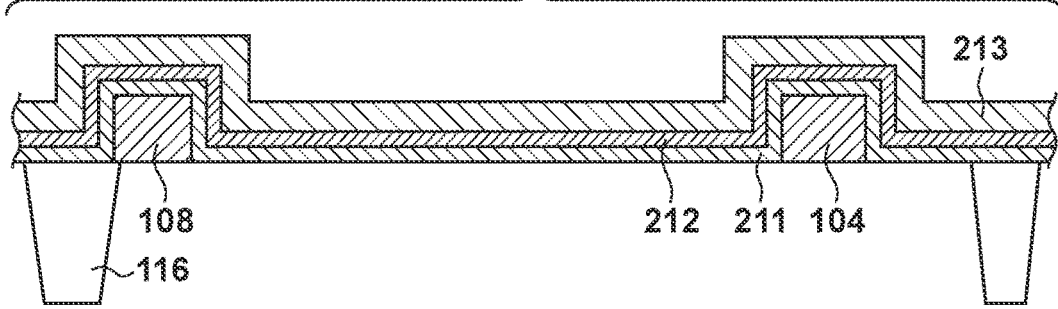
Figure 8D:
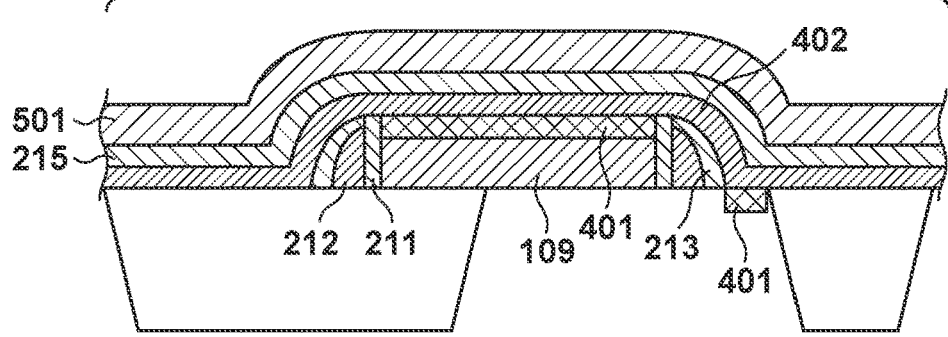

Next, a manufacturing method in a case in which the insulating layer 501 is used will be described. Here, a case in which the metal layer 111 is formed above a protective film 213 using silicon oxide without forming the adhesion layer 215 using silicon oxide in the pixel region 114 will be described. In this case, the protective film 213 functions as an adhesion layer. In addition, since the metal layer 111 is closer to a charge holding portion 102 than in the above-described first embodiment, the light shielding property can be higher. FIG. 8A (the pixel region 114) and FIG. 8B (the peripheral region 115) are sectional views obtained when silicon nitride 402, the adhesion layer 215, and the insulating layer 501 are deposited after the steps shown in FIGS. 3A and 3B described above are performed. When the insulating layer 501 is of the same film type as the insulating film 403, processing of opening a contact hole upon forming the contact plug 113 becomes easy. However, the insulating layer 501 may use an insulating material of a film type different from that of the insulating film 403. After the silicon nitride 402 and the insulating layer 501 are formed, the silicon nitride 402 and the insulating layer 501 in the pixel region 114 are etched, so that the silicon nitride 402 and the insulating layer 501 remain only in the peripheral region 115. Sectional views at this time are shown in FIG. 8C (the pixel region 114) and FIG. 8D (the peripheral region 115). Thereafter, steps after the step shown in FIGS. 3C and 3D described above are performed.

In this embodiment, the adhesion layer arranged below the metal layer 111 can be formed thicker in the peripheral region 115 than in the pixel region 114 and have an arbitrary thickness. For example, when adjusting the parasitic capacitance, the parasitic capacitance can be adjusted to a desired capacitance by arbitrarily changing the thickness of the insulating layer 501 and the dielectric constant of the insulating layer 501. As a result, not only the level difference between the regions is suppressed as described above, but also the parasitic capacitance is suppressed. Thus, the characteristics of the photoelectric conversion apparatus 100 can be further improved.

Applications

As applications of the photoelectric conversion apparatus 100 according to each of the above-described embodiments, an equipment including the photoelectric conversion apparatus 100 and a processing apparatus that processes a signal output from the photoelectric conversion apparatus. Here, an equipment in which the photoelectric conversion apparatus 100 is incorporated as an image capturing apparatus will be exemplified. The equipment in which the photoelectric conversion apparatus 100 is incorporated as the image capturing apparatus is, for example, an electric equipment such as a camera or smartphone. The camera conceptually includes not only an apparatus whose principal purpose is shooting but also an apparatus (for example, a personal computer or a mobile terminal such as a tablet) additionally provided with a shooting function.

Figure 9:
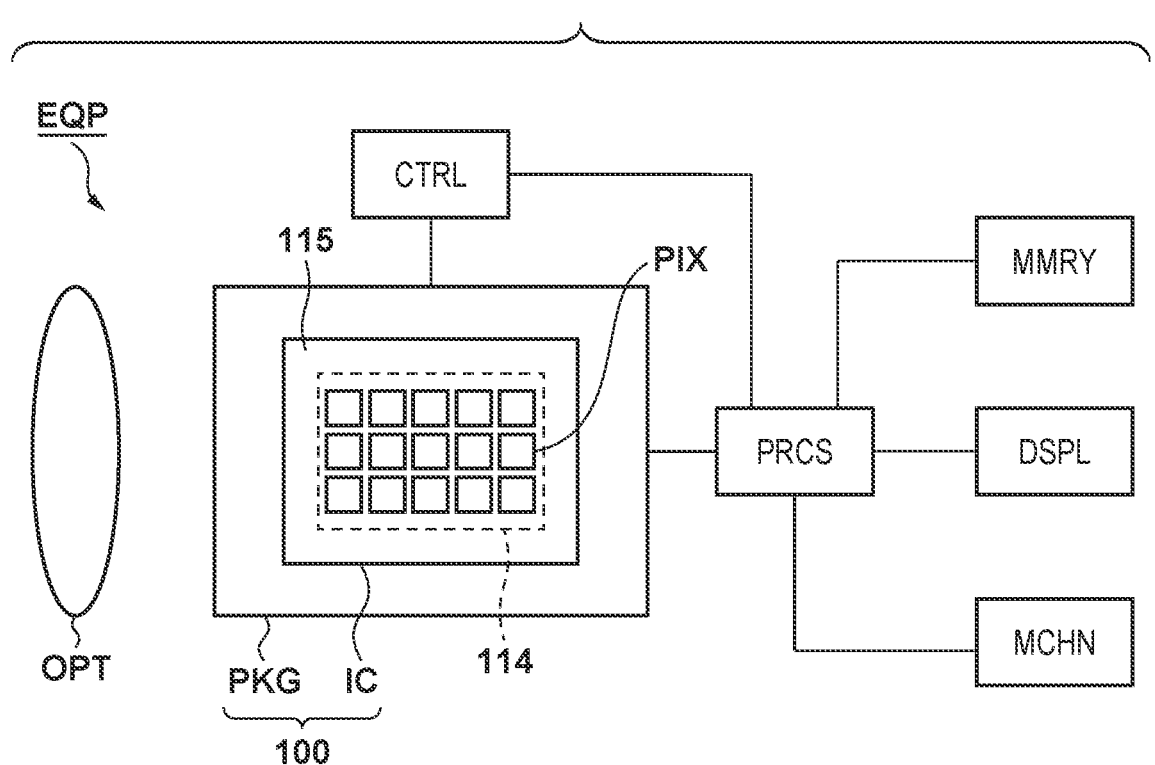
FIG. 9 is a block diagram showing an arrangement example of an equipment in which the photoelectric conversion apparatus shown in FIGS. 1A and 1B is incorporated.

FIG. 9 is a schematic view showing an equipment EQP mounted with the photoelectric conversion apparatus 100. An example of the equipment EQP is an electronic equipment (information equipment) such as a camera or smartphone as described above, an office equipment such as a copying machine or scanner, a transportation equipment such as an automobile, airplane, ship, or railroad car, a medical equipment such as an endoscope or radiation imaging apparatus, an analysis equipment such as a scanning electron microscope or transmission electron microscope, or an industrial equipment such as an industrial robot.

The photoelectric conversion apparatus 100 can include a package PKG that stores a semiconductor apparatus IC in addition to the semiconductor device IC including a semiconductor chip provided with the pixel region 114 in which the pixels PIX are arranged in an array. The package PKG can include a base on which the semiconductor device IC is fixed, a lid made of glass or the like facing the semiconductor device IC, and a connection member such as a bonding wire and bump for connecting a terminal of the base and a terminal of the semiconductor device IC. The equipment EQP can further include at least one of an optical system OPT, a control apparatus CTRL, a processing apparatus PRCS, a display apparatus DSPL, and a storage apparatus MMRY. The optical system OPT is a system that forms an image on the photoelectric conversion apparatus 100 and is implemented by, for example, a lens, a shutter, and a mirror. The control apparatus CTRL controls the operation of the photoelectric conversion apparatus 100 and is, for example, a semiconductor device such as an ASIC. The processing apparatus PRCS processes a signal output from the photoelectric conversion apparatus 100 and is a semiconductor device such as a CPU or ASIC for forming an AFE (Analog Front End) or a DFE (Digital Front End). The display apparatus DSPL is an EL display apparatus or liquid crystal display apparatus that displays information (image) obtained by the photoelectric conversion apparatus 100. The storage apparatus MMRY is a magnetic device or semiconductor device that stores the information (image) obtained by the photoelectric conversion apparatus 100. The storage apparatus MMRY is a volatile memory such as an SRAM or DRAM or a nonvolatile memory such as a flash memory or hard disk drive. A mechanical apparatus MCHN includes a moving or propulsion unit such as a motor or engine. The mechanical apparatus MCHN in the camera can drive the components of the optical system OPT in order to perform zooming, an in-focus operation, and a shutter operation. The equipment EQP displays the signal output from the photoelectric conversion apparatus 100 on the display apparatus DSPL and performs external transmission by a communication apparatus (not shown) of the equipment EQP. For this purpose, the equipment EQP may further include the storage apparatus MMRY and the processing apparatus PRCS in addition to the memory circuits and arithmetic circuits such as the control/signal processing circuits of the photoelectric conversion apparatus 100 included in, for example, the peripheral region 115.

Figure 10A:
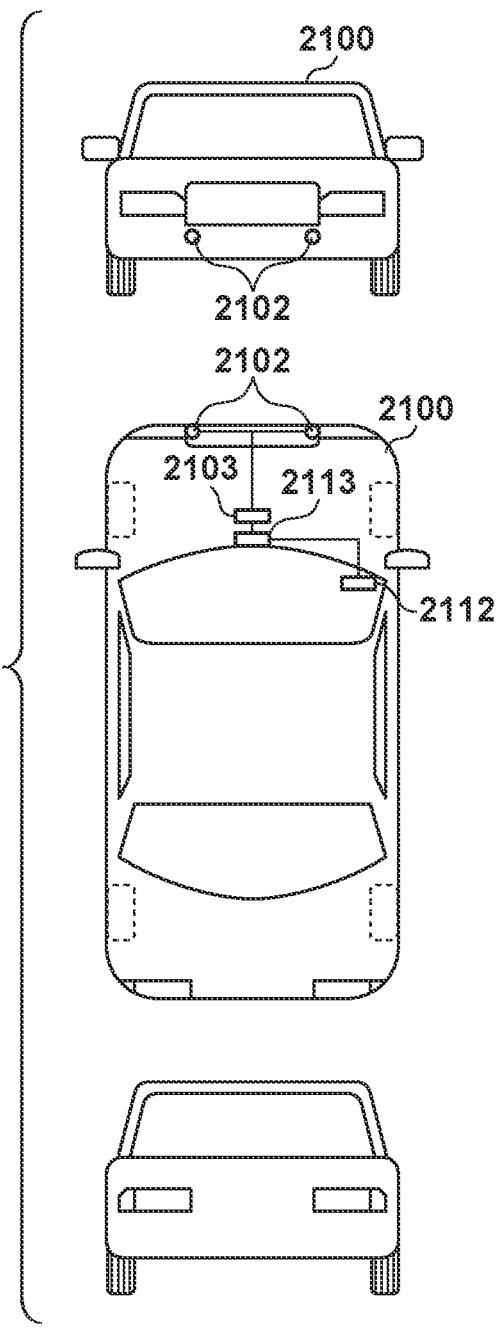
FIGS. 10A and 10B are views showing an arrangement example of an equipment in which the photoelectric conversion apparatus shown in FIGS. 1A and 1B is mounted.

A camera incorporating the photoelectric conversion apparatus 100 is also applicable to a surveillance camera, an onboard camera mounted in a transportation equipment such as an automobile or railroad car, or the like. An example in which the camera incorporating the photoelectric conversion apparatus 100 is applied to a transportation equipment will be exemplified. A transportation equipment 2100 is, for example, an automobile including an onboard camera 2101 shown in FIGS. 10A and 10B. FIG. 10A schematically shows the outer appearance and the main internal structure of the transportation equipment 2100. The transportation equipment 2100 includes photoelectric conversion apparatuses 2102, an image capturing system integrated circuit (ASIC: Application Specific Integrated Circuit) 2103, a warning apparatus 2112, and a control apparatus 2113.

The above-described photoelectric conversion apparatus 100 is used as each photoelectric conversion apparatus 2102. The warning apparatus 2112 warns a driver when it receives an abnormality signal from an image capturing system, a vehicle sensor, a control unit, or the like. The control apparatus 2113 comprehensively controls the operations of the image capturing system, the vehicle sensor, the control unit, and the like. Note the transportation equipment 2100 need not include the control apparatus 2113. In this case, the image capturing system, the vehicle sensor, and the control unit each individually include a communication interface and transmit/receive control signals via a communication network (for example, CAN standards).

Figure 10B:
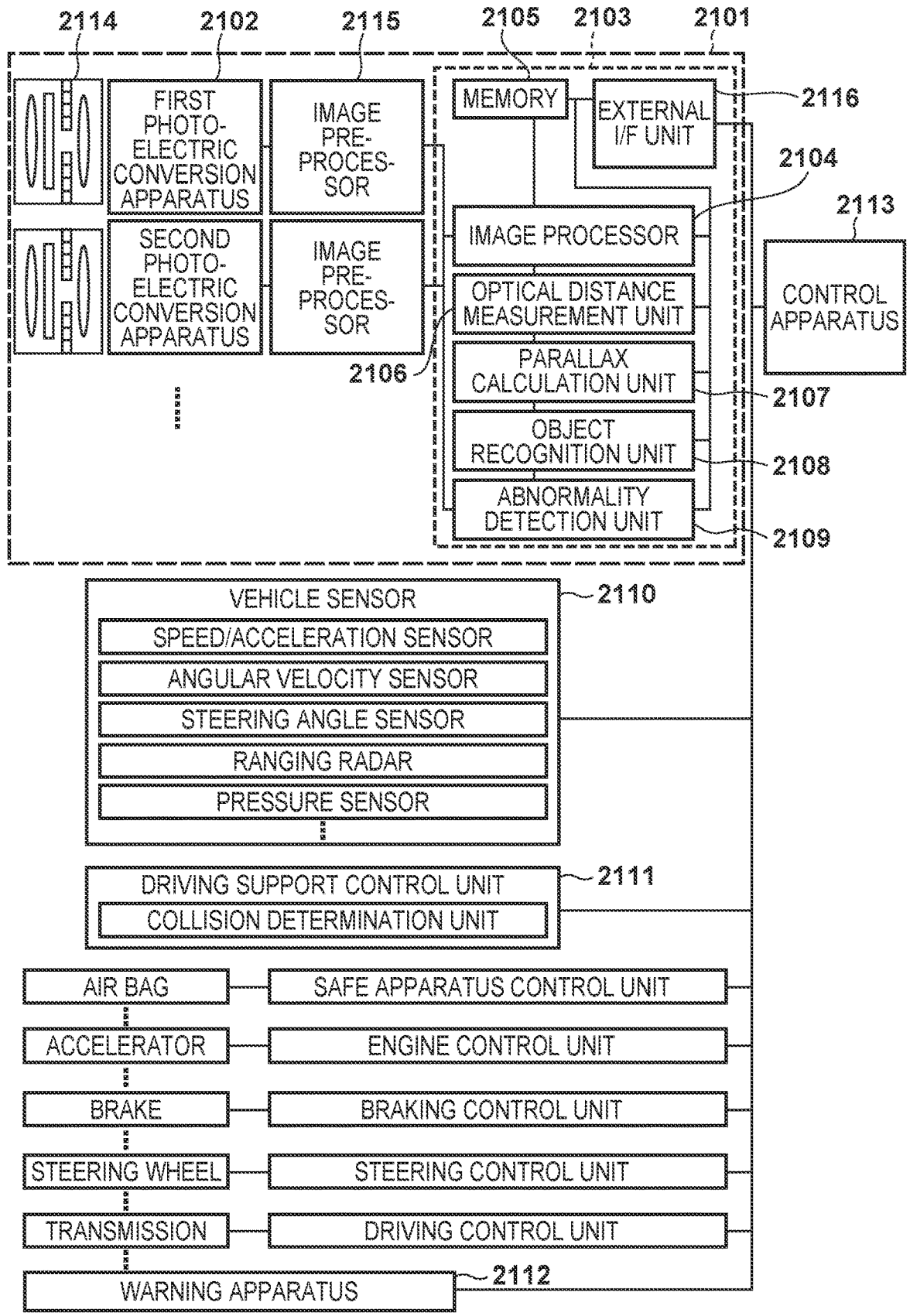

FIG. 10B is a block diagram showing the system arrangement of the transportation equipment 2100. The transportation equipment 2100 includes the first photoelectric conversion apparatus 2102 and the second photoelectric conversion apparatus 2102. That is, the onboard camera according to this embodiment is a stereo camera. An object image is formed by each optical unit 2114 on each photoelectric conversion apparatus 2102. A pixel signal output from each photoelectric conversion apparatus 2102 is processed by an image preprocessor 2115 and transmitted to the image capturing system integrated circuit 2103. The image preprocessor 2115 performs processing such as S-N calculation and synchronization signal addition.

The image capturing system integrated circuit 2103 includes an image processor 2104, a memory 2105, an optical distance measurement unit 2106, a parallax calculation unit 2107, an object recognition unit 2108, an abnormality detection unit 2109, and an external interface (I/F) unit 2116. The image processor 2104 generates an image signal by processing signals output from the pixels of each photoelectric conversion apparatus 2102. The image processor 2104 also performs correction of the image signal and interpolation of an abnormal pixel. The memory 2105 temporarily holds the image signal. The memory 2105 may also store the position of a known abnormal pixel in the photoelectric conversion apparatus 2102. The optical distance measurement unit 2106 uses the image signal to perform focusing or distance measurement of an object. The parallax calculation unit 2107 performs object collation (stereo matching) of a parallax image. The object recognition unit 2108 analyzes the image signal to recognize objects such as a transportation equipment, a person, a road sign, and a road. The abnormality detection unit 2109 detects the fault or an error operation of the photoelectric conversion apparatus 2102. When a fault or an error operation is detected, the abnormality detection unit 2109 transmits a signal indicating the detection of an abnormality to the control apparatus 2113. The external I/F unit 2116 mediates exchange of information between the units of the image capturing system integrated circuit 2103 and the control apparatus 2113 or the various kinds of control units.

The transportation equipment 2100 includes a vehicle information acquisition unit 2110 and a driving support unit 2111. The vehicle information acquisition unit 2110 includes vehicle sensors such as a speed/acceleration sensor, an angular velocity sensor, a steering angle sensor, a ranging radar, and a pressure sensor.

The driving support unit 2111 includes a collision determination unit. Based on the pieces of information from the optical distance measurement unit 2106, the parallax calculation unit 2107, and the object recognition unit 2108, the collision determination unit determines whether there is the possibility of a collision with an object. The optical distance measurement unit 2106 and the parallax calculation unit 2107 are examples of distance information acquisition units that acquire distance information of a target object. That is, distance information includes pieces of information concerning the parallax, the defocus amount, the distance to the target object, and the like. The collision determination unit may use one of these pieces of distance information to determine the possibility of a collision. Each distance information acquisition unit may be implemented by specially designed hardware or a software module.

An example in which the driving support unit 2111 controls the transportation equipment 2100 so as to avoid a collision with another object has been described. However, the present invention is also applicable to control for automated driving following another vehicle or automated driving without deviation from a lane.

The transportation equipment 2100 also includes driving apparatuses which are used for movement or for supporting the movement, such as an air bag, an accelerator, a brake, a steering wheel, a transmission, an engine, a motor, wheels, and propellers. The transportation equipment 2100 also includes control units for these apparatuses. Each control unit controls a corresponding driving apparatus based on a control signal of the control apparatus 2113.

The photoelectric conversion apparatus 100 used in this embodiment is broadly applicable not only to an automobile but also to, for example, a transportation equipment such as a ship, airplane, or railroad car, or an industrial equipment such as an industrial robot. In addition, the photoelectric conversion apparatus 100 is applicable not only to a transportation equipment but also to an equipment that widely uses object recognition, such as various types of equipment as described above or ITS (Intelligent Transportation System).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-133124, filed on Jul. 18, 2019, which is hereby incorporated by reference herein in its entirety.

What is claimed is:

1. A photoelectric conversion apparatus comprising:
a pixel region in which a plurality of pixels each including a photoelectric conversion portion and a charge holding portion formed in a substrate are arranged; and
a peripheral region arranged around the pixel region, wherein NMOS and PMOS transistors are arranged in the peripheral region,
wherein above the substrate are provided:
an electrically conductive layer including an electrode pattern for transferring charges in the photoelectric conversion portion to the charge holding portion,
a wiring layer including a wiring pattern electrically connected to the electrode pattern,
an interlayer insulating film arranged between the wiring layer and the substrate,
a metal layer arranged between the interlayer insulating film and the substrate, and arranged so as to cover at least the charge holding portion and the electrode pattern, and
a contact plug configured to electrically connect the wiring pattern and the electrode pattern and extending through the interlayer insulating film, and
in the peripheral region, the metal layer covers at least a part of an upper surface of an electrically conductive pattern of each of the NMOS and PMOS transistors, wherein the electrically conductive pattern is included in the electrically conductive layer.

2. A photoelectric conversion apparatus comprising:
a pixel region in which a plurality of pixels each including a photoelectric conversion portion and a charge holding portion formed in a substrate are arranged; and
a peripheral region arranged around the pixel region, wherein NMOS and PMOS transistors are arranged in the peripheral region,
wherein above the substrate are provided:
an electrically conductive layer including an electrode pattern for transferring charges in the photoelectric conversion portion to the charge holding portion,
a wiring layer including a wiring pattern electrically connected to the electrode pattern,
an interlayer insulating film arranged between the wiring layer and the substrate,
a metal layer arranged between the interlayer insulating film and the substrate, and
a contact plug configured to electrically connect the wiring pattern and the electrode pattern and extending through the interlayer insulating film, and
the metal layer separately includes a pattern that covers at least the charge holding portion and the electrode pattern in the pixel region and a pattern that covers at least a part of an upper surface of an electrically conductive pattern of each of the NMOS and PMOS transistors, wherein the electrically conductive pattern is included in the electrically conductive layer in the peripheral region.

3. The apparatus according to claim 2, wherein in the peripheral region, an upper surface of the metal layer has unevenness according to the electrically conductive pattern.

4. The apparatus according to claim 2, wherein in orthographic projection to the substrate, when a coverage of the metal layer in the pixel region is A and a coverage of the metal layer in the peripheral region is B, B/A≥0.3 holds.

5. The apparatus according to claim 2, wherein a height from the substrate to an upper surface of a portion of the metal layer arranged above the electrode pattern is same as a height from the substrate to an upper surface of a portion of the metal layer arranged above the electrically conductive pattern.

6. The apparatus according to claim 2, wherein a height from an upper surface of the electrically conductive pattern to a portion of the metal layer arranged above the electrically conductive pattern is larger than a height from an upper surface of the electrode pattern to a portion of the metal layer arranged above the electrode pattern.

7. The apparatus according to claim 6, wherein a height from the substrate to an upper surface of the portion of the metal layer arranged above the electrode pattern is smaller than a height from the substrate to an upper surface of the portion of the metal layer arranged above the electrically conductive pattern.

8. The apparatus according to claim 2, wherein the metal layer is electrically connected to the substrate by a contact plug different from the contact plug.

9. The apparatus according to claim 2, wherein the metal layer is fixed at a constant potential while the photoelectric conversion apparatus is operating.

10. The apparatus according to claim 2, wherein the pattern included in the metal layer arranged in the pixel region is electrically connected to the substrate via a plug between a surface of the metal layer on a side of the substrate and a surface of the substrate on a side of the metal layer.

11. The apparatus according to claim 2, wherein the pattern included in the metal layer arranged in the peripheral region is electrically connected to the electrically conductive pattern via a plug between a surface of the metal layer on a side of the substrate and a surface of the electrically conductive pattern on a side of the metal layer.

12. The apparatus according to claim 2, wherein the electrically conductive layer is formed of polysilicon, and the metal layer is formed of tungsten.

13. The apparatus according to claim 2, wherein of the electrically conductive pattern, the electrically conductive pattern covered by the metal layer includes the electrically conductive pattern in which an entire circumference of a side surface is arranged on an insulator.

14. The apparatus according to claim 2, wherein of the electrically conductive pattern, the electrically conductive pattern covered by the metal layer includes a silicide layer.

15. The apparatus according to claim 2, wherein of the electrically conductive pattern, the electrically conductive pattern covered by the metal layer includes a gate electrode of a transistor that includes a silicide layer in a source/drain region.

16. The apparatus according to claim 2, wherein the pattern included in the metal layer connects a first transistor and a second transistor to each other.

17. The apparatus according to claim 2, wherein the pattern included in the metal layer connects a gate electrode of a first transistor and one of a source and a drain of a second transistor.

18. The apparatus according to claim 2, wherein the metal layer surrounds a contact plug that extends through the interlayer insulating film and electrically connects the wiring layer and the electrically conductive layer.

19. An equipment comprising:
a photoelectric conversion apparatus according to claim 2, and
a processing apparatus configured to process a signal output from the photoelectric conversion apparatus,
wherein the photoelectric conversion apparatus is a CMOS image sensor having a global electronic shutter function.

20. A photoelectric conversion apparatus comprising:
a pixel region in which a plurality of pixels each including a photoelectric conversion portion and a charge holding portion formed in a substrate are arranged; and
a peripheral region arranged around the pixel region,
wherein above the substrate are provided:
an electrically conductive layer including an electrode pattern for transferring charges in the photoelectric conversion portion to the charge holding portion,
a wiring layer including a wiring pattern electrically connected to the electrode pattern,
an interlayer insulating film arranged between the wiring layer and the substrate,
a metal layer arranged between the interlayer insulating film and the substrate, and
a contact plug configured to electrically connect the wiring pattern and the electrode pattern and extending through the interlayer insulating film, and
the metal layer separately includes a pattern that covers at least the charge holding portion and the electrode pattern in the pixel region and a pattern that covers at least a part of an upper surface of an electrically conductive pattern included in the electrically conductive layer in the peripheral region,
wherein the electrode pattern is a gate electrode of an NMOS transistor, and the electrically conductive pattern is a gate electrode of a PMOS transistor.

* * * * *